United States Patent
Blair et al.

(10) Patent No.: US 9,361,419 B2
(45) Date of Patent: Jun. 7, 2016

(54) CONSTRAINED PLACEMENT OF CONNECTED ELEMENTS

(71) Applicant: ESS Technology, Inc., Fremont, CA (US)

(72) Inventors: Robert L. Blair, Pleasanton, CA (US); Daniel A. Risler, Kelowna (CA); A Martin Mallinson, Kelowna (CA)

(73) Assignee: ESS Technology, Inc., Milpitas, CA (US)

( * ) Notice: Subject to any disclaimer, the term of this patent is extended or adjusted under 35 U.S.C. 154(b) by 0 days.

(21) Appl. No.: 14/453,585

(22) Filed: Aug. 6, 2014

(65) Prior Publication Data

US 2015/0046894 A1 Feb. 12, 2015

Related U.S. Application Data

(60) Provisional application No. 61/862,891, filed on Aug. 6, 2013.

(51) Int. Cl.
*G06F 17/50* (2006.01)
*H01L 27/02* (2006.01)

(52) U.S. Cl.
CPC ........ *G06F 17/5072* (2013.01); *G06F 17/5077* (2013.01); *G06F 17/5045* (2013.01); *G06F 17/5068* (2013.01); *G06F 17/5081* (2013.01); *H01L 27/0207* (2013.01)

(58) Field of Classification Search
CPC ............ G06F 17/5072; G06F 17/5077; G06F 17/5068; G06F 17/5081; G06F 17/5045; H01L 27/0207
USPC ......... 716/119, 123, 124, 125, 126, 130, 132, 716/139
See application file for complete search history.

(56) References Cited

U.S. PATENT DOCUMENTS

| | | | | |
|---|---|---|---|---|
| 4,745,084 A | * | 5/1988 | Rowson | G06F 17/5068 257/206 |
| 5,619,420 A | * | 4/1997 | Breid | G06F 17/5031 716/113 |
| 6,223,330 B1 | * | 4/2001 | Risler | G06F 17/505 716/119 |
| 6,370,677 B1 | * | 4/2002 | Carruthers | G06F 17/5072 716/121 |
| 6,393,600 B1 | * | 5/2002 | Sribhashyam | G11C 7/22 365/189.05 |
| 6,546,538 B1 | * | 4/2003 | Rubdi | G06F 17/5077 716/115 |
| 6,823,500 B1 | * | 11/2004 | Ganesh | G06F 17/5072 716/115 |
| 6,928,631 B2 | * | 8/2005 | Matsumoto | G06F 17/5031 716/114 |
| 7,257,794 B2 | * | 8/2007 | Tang | G06F 17/5068 716/122 |
| 7,418,683 B1 | | 8/2008 | Sonnard | |
| 7,685,551 B2 | * | 3/2010 | Toubou | G06F 17/5072 716/119 |
| 7,739,646 B2 | * | 6/2010 | Lin | G06F 17/5077 716/119 |
| 7,971,168 B1 | * | 6/2011 | Swanson | G06F 17/5045 716/108 |
| 8,453,097 B2 | | 5/2013 | Mallinson | |

(Continued)

Primary Examiner — Helen Rossoshek
(74) Attorney, Agent, or Firm — Gard & Kaslow LLP

(57) ABSTRACT

An improved method for the placement and routing of compound elements, each comprising a series/parallel combination of nominally identical elements, is disclosed. The method treats each compound element as a separate cell (the sub-circuit construct commonly used in silicon chip design) so as to treat as a unit all the nominally identical elements that make up a compound value, and place them as a single group in the design of a chip. This results in the compound elements being placed as units and routed in such a way that all of the nominal elements are located together and any effects between compound values are thus relatively localized and optimally isolated.

16 Claims, 5 Drawing Sheets

(56) References Cited

U.S. PATENT DOCUMENTS

| | | | |
|---|---|---|---|
| 9,098,663 B2* | 8/2015 | Mallinson | G06F 17/5063 |
| 2004/0025130 A1* | 2/2004 | Jaska | G06F 17/5068 |
| | | | 716/119 |
| 2004/0031002 A1* | 2/2004 | Du | G06F 17/5063 |
| | | | 716/105 |
| 2009/0239313 A1 | 9/2009 | Anemikos et al. | |
| 2009/0322575 A1* | 12/2009 | Tukel | H03M 1/1061 |
| | | | 341/121 |
| 2012/0151427 A1* | 6/2012 | Newcom | G06F 17/5036 |
| | | | 716/109 |
| 2012/0246607 A1 | 9/2012 | Mallinson | |
| 2012/0254817 A1 | 10/2012 | Sherlekar | |
| 2014/0109027 A1* | 4/2014 | Su | H01L 23/481 |
| | | | 716/55 |
| 2014/0173544 A1* | 6/2014 | Giraud | G06F 17/5068 |
| | | | 716/119 |
| 2015/0186591 A1* | 7/2015 | Gurney | G06F 17/5081 |
| | | | 716/116 |
| 2015/0270380 A1* | 9/2015 | Bedell | H01L 29/7786 |
| | | | 257/76 |

\* cited by examiner

CONSTRAINED PLACEMENT OF CONNECTED ELEMENTS

This application claims priority from Provisional Application Ser. No. 61/862,891, filed Aug. 6, 2013, which is incorporated by reference herein in its entirety.

FIELD OF THE INVENTION

The present invention relates generally to the design of electronic circuits. More specifically, the invention relates to methods for implementing components of arbitrary values in semiconductor circuits.

BACKGROUND OF THE INVENTION

Semiconductor circuits formed on semiconductor chips, or wafers, include a number of types of circuit elements, including, for example, resistors, capacitors, inductors, transistors, etc. These elements must be created on the semiconductor chip in a way that the value or performance of the element meets the requirements of the circuit in which they are included.

Any semiconductor material has certain characteristics, and some of these are such that an element constructed on the semiconductor will have a certain value that depends in whole or part upon the area occupied by the element. A number of elements, including resistors, capacitors and inductors, are thus typically created as geometric shapes of a size that, given the characteristics of the semiconductor, will result in a particular specified value.

In particular, certain designs require the use of such elements that are arbitrarily different in value but have a particular ratio. For example, to achieve a gain of 3.33, an operation amplifier may be configured in a so-called virtual ground configuration with a 1000 ohm ($\Omega$) resistor and a 3,330$\Omega$ resistor (or 3.33 kilohms (k$\Omega$); 1000$\Omega$=1 k$\Omega$). One known way of achieving this is to use a resistor of a given width and length for the input 1 k$\Omega$ resistor (the sheet resistance of the semiconductor material will determine the area of the resistor), and another resistor of the same width but 3.33 times the length of the 1 k$\Omega$ resistor for the 3.33 k$\Omega$ feedback resistor.

One of skill in the art will appreciate certain problems inherent in such construction. For example, the physical dimensions of an element are susceptible to errors or variations in the manufacturing process, which may not be able to reliably or repeatedly make the precise dimensions determined to yield the desired value for the resistor. Even small errors in the dimensions of the desired 1 k$\Omega$ and 3.33 k$\Omega$ resistors in the above example may result in significant differences in their actual resistances and, more importantly, in the ratio between them. While such dimensional errors may seem small, they may be enough to degrade the accuracy or performance of the circuit on the semiconductor chip.

Still further, in building elements on a semiconductor chip, it is necessary to make connections to the material. For example, to build a poly-silicon resistor on a chip there must be contact holes, and sometimes different doping levels at each end, for the metal traces to make good contact. The contact holes and associated features introduce an "end effect," which is typically an unwanted additional resistance in series with the intended resistance, and is thus to be added to the value of the resistance as designed. This additional resistance generally depends largely upon how accurately the contact holes are cut in the chip material; it also creates a difference or error from the desired value, creating a resistance higher than intended, and makes it hard to match dissimilar values precisely since the unwanted end effect resistance may not be precisely known.

Again, in the example above, if two resistors are built to precise sizes to result in one resistor being 1 k$\Omega$ and the other being 3.33 k$\Omega$, if the "end effect" adds, for example, 100$\Omega$ to each value, then the ratio between what are effectively a 1.1 k$\Omega$ resistor and a 3.43 k$\Omega$ resistor becomes 3.118 rather than the desired 3.33, an error of almost 7 percent. Again, this may significantly alter the desired performance of the circuit. These issues make it difficult to implement elements on semiconductor chips having precise values, and more specifically to implement multiple elements with precise ratios between their values.

One possible solution is provided in U.S. Pat. No. 8,453, 097 (hereafter "the '097 patent"), commonly assigned to the assignee of the present application, which in some embodiments contemplates constructing a specified circuit element of arbitrary value as a compound element made from a number of nominally identical impedance elements. As explained therein, such a construction may reduce or eliminate many of the problems described above.

However, it must still be determined where to locate the nominal elements of such a compound element on a potential chip and how to connect them. Automated tools, such as "place and route tools" from, for example, Cadence or Synopsys, may be used to try to optimize the location and interconnection of the elements. However, these tools will normally consider the nominally identical elements as all separate elements to be placed, and may locate them in a way that causes certain undesirable phenomena, such as capacitive coupling or stray capacitance to a bulk node, if the place and route tool follows the industry standard "congestion based" placement.

Accordingly, a better way of optimizing the placement and routing of the nominally identical elements contained within compound elements is desirable.

SUMMARY OF THE INVENTION

An improved method for defining components for placement and routing on a semiconductor chip is disclosed.

One embodiment discloses a method of defining components for placement and routing on a semiconductor chip, comprising: receiving by a processor a design of an overall circuit including a specified element having a selected value and that is suitable of being made as a series and/or parallel combination of a plurality of nominally identical elements; defining by the processor a uniform cell requiring a place and route tool to place the uniform cell as a single unit, the definition: including a selected number of the nominally identical elements, each nominally identical element having a plurality of ports; and not including any connections of the ports of the nominally identical elements; defining by the processor a compound element as a series and/or parallel combination of some or all of the selected number of the nominally identical elements, such that: the value of the compound element is the selected value of the specified element; and the definition of the compound element has instructions for the place and route tool to connect some or all of the ports of the nominally identical elements of the defined uniform cell so as to form the compound element.

Another embodiment discloses a method of defining components for placement and routing on a semiconductor chip, comprising: receiving by a processor a design of an overall circuit including a first specified element having a first selected value and a second specified element having a second selected value, the first and second specified elements each suitable of being made as a series and/or parallel combination of a plurality of nominally identical elements; defining by the processor a uniform cell requiring a place and route tool to place the uniform cell as a single unit, the definition: including a selected number of the nominally identical elements, each nominally identical element having a plurality of ports; and not including any connections of the ports of the nominally identical elements; defining by the processor a first compound element and a second compound element each as a separate series and/or parallel combination of some or all of the selected number of the nominally identical elements, such that: the value of the first compound element is the selected value of the first specified element and the value of the second compound element is the selected value of the second specified element; and the definition of the first compound element has instructions for the place and route tool to connect some or all of the ports of the nominally identical elements of a first instance of the defined uniform cell so as to form the first compound element, and the definition of the second compound element has instructions for the place and route tool to connect some or all of the ports of the nominally identical elements of a second instance of the defined uniform cell so as to form the second compound element.

Still another embodiment discloses a non-transitory computer readable storage medium having embodied thereon instructions for causing a computing device to execute a method of defining components for placement and routing on a semiconductor chip, the method comprising: receiving by a processor a design of an overall circuit including a specified element having a selected value and that is suitable of being made as a series and/or parallel combination of a plurality of nominally identical elements; defining by the processor a uniform cell requiring a place and route tool to place the uniform cell as a single unit, the definition: including a selected number of the nominally identical elements, each nominally identical element having a plurality of ports; and not including any connections of the ports of the nominally identical elements; defining by the processor a compound element as a series and/or parallel combination of some or all of the selected number of the nominally identical elements, such that: the value of the compound element is the selected value of the specified element; and the definition of the compound element has instructions for the place and route tool to connect some or all of the ports of the nominally identical elements of the defined uniform cell so as to form the compound element.

DETAILED DESCRIPTION OF THE INVENTION

Figure 1:
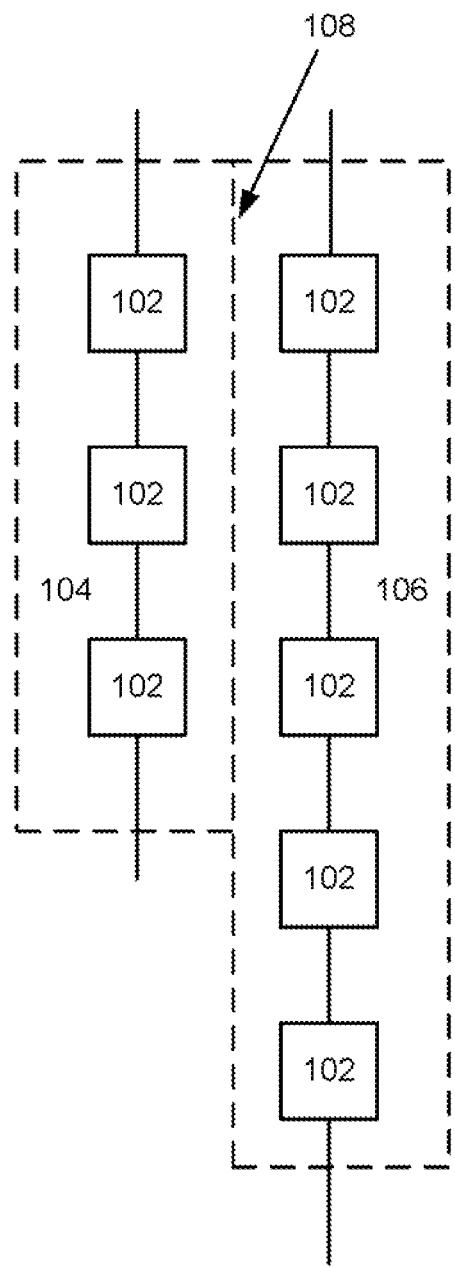
FIG. 1 is an example of how compound groups of individual elements may be treated by traditional place and route tools.

Described herein is a method and system for the placement and routing of multiple compound elements, each compound element comprising a series and/or parallel combination of nominally identical elements. Using the techniques described herein, a chip designer can implement a method of placing and routing such compound elements that results in less undesirable interaction between the elements than in typical prior art approaches.

In the described method, each compound element is treated as a separate cell (the sub-circuit construct commonly used in silicon chip design) for placement and routing, so as to treat as a unit all the nominal elements that make up a compound value, and place them as a single group in the design of a chip. This results in the compound elements being placed and routed in such a way that all of the nominally identical elements of a compound element are located together and any effects between compound elements are thus relatively localized and optimally isolated. The place and route tool only makes interconnections of the nominally identical elements after the nominally identical elements making up a compound value have been placed.

While the description herein focuses on resistors, the described method may also be used with other impedance elements, such as inductors, capacitors, field effect transistors (FETs, used as impedance elements rather than logic elements) and any other electrical elements where a specified circuit element is required to have an arbitrary (non-logic) value, or two such elements are required to differ in parametric value. It will often be more accurate to generate such a value, or difference in value, by constructing such elements from a combination of nominally identical elements as described in the '097 patent.

As above, the method of the '097 patent, which uses nominally identical elements in series and parallel combinations to create a compound element for use as a specified element having an arbitrary target value, has a number of benefits over the prior art. One such benefit is improved consistency of the ratio of such a compound element to one of the identical elements, and thus the ratio between two compound elements, regardless of variations in the manufacturing process. Another benefit is the decreased impact of the "end effects" described above, since such effects will be randomly spread over a greater number of nominally identical elements.

Place and route tools typically receive a description, called a netlist, of an overall circuit to be fabricated on a semiconductor chip, which defines units known as "cells" and the physical connections to be made between those cells. The tools work by placing the described cells into a physical arrangement according to some algorithm, and connecting the cells to each other according to the netlist.

Cells are typically defined so that they have a single component or function inside, and any component which has multiple elements, such as a logic gate made of two or more transistors, has a netlist description in which those elements are already connected together. A cell thus typically has one or more ports for inputs and one or more ports for outputs. Since a cell typically has a single component or function, there has traditionally been no reason to connect two ports of a cell to each other.

There are a number of libraries of industry-standard cells that are generally used for common semiconductor manufacturing processes, and place and route tools work well on these. Some of these standard cells are provided by semiconductor manufacturers such as Taiwan Semiconductor Manufacturing Company Ltd., and others are provided by developers of circuits for specific purposes such as ARM Inc.

However, none of these libraries contain resistor elements (as opposed to parasitic resistances which may exist in, for example, connections to logic gates). Further, none of the current place and route tools even model resistors as they do other cells in order to determine their required area for placement, although a resistor element of a given length and width, as in the prior art described above, may be defined as a cell and put in a netlist, and then made when the chip is manufactured.

Thus, when dealing with compound elements comprised of a number of nominally identical elements as described in the '097 patent, most industry standard place and route tools will not seek to place the compound element as a single unit, but rather will regard each of the nominally identical elements as separate elements and seek to place them according to their programmed algorithm.

As is known in the art, the typical place and route tool uses either what is known as a "congestion based" algorithm, which will seek to minimize the number of wires between elements in a given area, or a "timing based" algorithm which will meet the required timing or delay between elements. However, neither of these methods is particularly useful in dealing with the placement of passive components, or analog components in general.

Further, while the potentially tedious process of designing the layout of a chip is thus made less complex and more convenient by the use of such compound elements, certain other problems can arise. In some cases, such placement may result in nominally identical elements that are part of a single compound element being located in different areas of a chip, or intermingled with nominally identical elements of another compound element in a way that can also create undesirable phenomena such as capacitive coupling between elements or stray capacitance to a bulk node.

FIG. 1 illustrates a simple example of this. In this example, two resistors, one of 3Ω and one of 5Ω are each compound resistors constructed from nominal 1Ω resistors 102. As is apparent to one of skill in the art, the 3Ω resistor 104 requires three of the 1Ω resistors in series, and the 5Ω resistor 106 requires five of the 1Ω resistors in series. If a typical place and route tool is told to place the eight 1Ω resistors in as compact a fashion as possible, the congestion based algorithm might place and route the resistors as shown in FIG. 1. This solution is not an optimum one, as the two compound resistors 104 and 106 now share a long common border 108, and there will be an undesirable stray capacitance, i.e., a slight difference in electric charge due to the currents flowing in each, between them.

Similar problems may arise in more complex situations. For example, one embodiment described in the '097 patent contemplates the use of a group of 16 nominally identical elements to construct a specified element of an arbitrary value as a compound element. Where there are two such compound elements, a place and route tool may try to optimize the positions of the nominal elements to minimize those aspects under the tool's control, without regard for the fact that it may be desirable that the nominal elements of one group (i.e., one compound element) do not interact with the nominal elements of the other group. Thus, the place and route tool may place nominal elements of one group in close proximity to those of another group and so allow capacitive coupling, or other undesired effects, to occur between the elements of the groups. In addition, the place and route tool may not achieve the most efficient interconnection pattern, in terms of length and/or delay, between the nominal elements of each group, possibly resulting in additional capacitance between longer wires, created by the inefficient routing, and the substrate on which the interconnection of elements is constructed.

In one embodiment, the present method treats each compound element as a single cell, i.e., a separate level of design hierarchy. This can improve the performance of such tools by ensuring that all of the nominal identical elements in each compound element are kept within the cell, thus limiting any such undesirable effects.

As in the '097 patent, in order to use the complex series and/or parallel configurations of repeated elements contemplated, it is helpful to have some way of representing such structures mathematically as well as pictorially. The example described herein uses the same algebraic notation used in the '097 patent, one which has been developed to allow such configurations to be expressed mathematically, as well as allowing a software language to operate on such expressions.

The prefix notation uses two defined operators. One operator is "s" representing series connection of elements, and the other operator is "p" representing parallel connection of elements. Each operator accepts any arbitrary number of operands.

As will be understood by those of skill in the art, considered as data, an "s" or "p" expression is a list structure, the first item of the list being the operator and successive items being the operands. Operands are evaluated from left to right, and any list operands are recursively evaluated. Thus, as one example, the expression $$(s2(p3))$$

is a list of three items, "s," "2," and "(p 3)." The first item of the list is "s," the operator. The second item "2" is the first argument to "s," and the third item, "(p 3)" is the second argument to "s," and is itself a list.

The arguments to the "s" and "p" operators are operands that are either other expressions of "s" and "p" or non-zero cardinal numbers representing the number of repeated elements to which the operator is to be applied. For example, the expression "(s 3)" represents the "s" or series operator applied to a single argument, the cardinal number 3, representing three repeated elements. Evaluation of "(s 3)" by the evaluator defined above results in the number 3, and thus in three elements being placed in series.

The expression "(s 2 (p 3))" represents the "s" series operator applied to two arguments. The first argument is the cardinal number 2, representing two repeated elements to be placed in series. The second argument is "(p 3)," representing the "p" parallel operator applied to the cardinal number 3, representing three repeated elements to be placed in parallel, and this parallel configuration to then be placed in series with the other two elements.

This recursive analysis may be repeated as often as necessary. Thus, to construct an expression representative of the series or parallel combination of any other two expressions is equivalent to repeatedly constructing a list of three items, the first item being "s" or "p," the second item being the first of the two expressions, and the third item being the other expression.

For example, if two structures A=(s 4) and B=(s 2 (p 3)) are to be constructed in parallel, the list "(p A B)" is created, and may be written as:

$$(p(s4)(s2(p3)))$$

Similarly, the series combination is "(s A B)" or:

$$(s(s4)(s2(p3)))$$

It may also be seen that simplification is sometimes possible. For example, in the last series combination, since A contains four elements in series and is itself in series with B, which contains two more elements in series, the expression may be simplified to:

$$(s6(p3))$$

Figure 2:
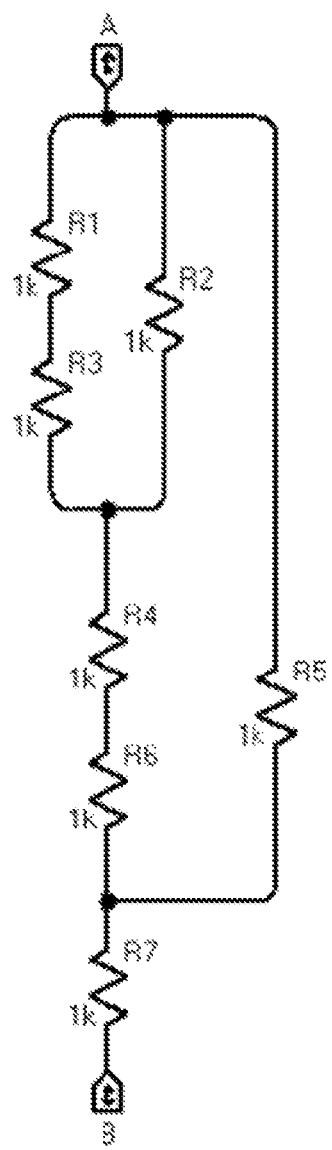
FIG. 2 shows one possible way of constructing a specified resistor as a combination of seven resistors each having an identical nominal value.

As a further example of this notation, FIG. 2 shows a combination of resistors R1 to R7. Resistors R1, R2 and R3 are represented as (p 1 (s 2)), since two resistors R1 and R2 are in series, and that combination is then in parallel with another resistor R3. Adding resistors R4 and R6 in series with these results in:

(s2(p1(s2)))

Putting this combination in parallel with resistor R5 yields the expression:

(p1(s2(p1(s2))))

Finally, adding resistor R7 to this combination results in the overall expression for FIG. 2 of:

(s1(p1(s2(p1(s2)))))

Turning to the described method, to implement a circuit design containing a specified element of arbitrary value, the first step according to one embodiment is to determine a series/parallel combination of multiple distinct and nominally identical elements that results in the arbitrary value. Such a compound element may contain any arbitrary cardinal number of such nominally identical elements. In one example in the '097 patent, it is contemplated that there may be, for example, 16 nominally identical resistors in a compound element.

A uniform cell is then defined, having the cardinal number of nominally identical elements, the elements being initially unconnected. The cell definition may contain other parameters, for example, a specified "buffer zone" around the nominally identical elements, or a specified distance that the cell should be located from other cells on the chip.

In general, an algorithm may be used to determine the way in which the nominally identical elements should be connected in order to obtain a desired target value. One such type of algorithm is described in the '097 patent, which in some embodiments makes an exhaustive search of all possible combinations of the nominally identical elements in the cell. In such a case, the algorithm will be given the target value, the value of each of the nominally identical elements, and the number of nominally identical elements in the cell. In some cases, a recursive algorithm may be used, such as is described in U.S. patent application Ser. No. 14/446,780 ("the '780 application"), commonly owned by the assignee of the present application, or the connections between nominally identical elements may even be determined by a designer.

Where an algorithm is used, it is desirable that it return a descriptor of the selected series and/or parallel combination of the nominally identical elements that will result in the target value. In the algebra described above, for example, an algorithm as described in the '097 patent, when given a target of 1.23455 kΩ a nominal value of 1 kΩ, and 16 resistors in the cell, will return the configuration specified by:

(s(p2)(p(s3)(s(p2)(p1(s2)(s1(p1(s1(p1(s2)))))))))

This configuration is then converted to a netlist. In SPICE format, without using the present invention, this compound resistor, connected between nodes "DVcc" (i.e., voltage) and "DGnd" (i.e., ground) is as follows (the intermediate

* R1 has a Series/parallel Specification.
* (s (p 2) (p (s 3) (s (p 2) (p 1 (s 2) (s 1 (p 1 (s 1 (p 1 (s 2)))))))))
* Value 1000.0 as connected makes 1.23455K
R1_R1 DVcc N0 1000.0
R1_R2 DVcc N0 1000.0
R1_R4 N0 N3 1000.0
R1_R6 N3 N5 1000.0

-continued

R1_R7 N5 DGnd 1000.0
R1_R9 N0 N8 1000.0
R1_R10 N0 N8 1000.0
R1_R11 N8 DGnd 1000.0
R1_R13 N8 N12 1000.0
R1_R14 N12 DGnd 1000.0
R1_R16 N8 N15 1000.0
R1_R17 N15 DGnd 1000.0
R1_R19 N15 N18 1000.0
R1_R20 N18 DGnd 1000.0
R1_R22 N18 N21 1000.0
R1_R23 N21 DGnd 1000.0

In many, if not most, situations there are more than one compound element, or group of nominally identical components, to be used in the same construction, i.e., typically on the same semiconductor chip. If there are, for example, two compound elements, the set SPICE netlist format of the set of nominal elements will be in a similar format. For example, here is the SPICE netlist for two compound elements, one connected between points A and C in a circuit, and another between points B and D in the circuit, again without the benefit of the present approach. The first compound element has a series/parallel combination of 1 kΩ resistors to make a target value of 1.23455 kΩ, and the second compound element has a series/parallel combination of 1 kΩ resistors to make a target value of 2.34568 kΩ:

* R1 has a Series/parallel Specification.
* (s (p 2) (p (s 3) (s (p 2) (p 1 (s 2) (s 1 (p 1 (s 1 (p 1 (s 2)))))))))
* Value 1000.0 as connected makes 1.23455K
R1_R1 A N0 1000.0
R1_R2 A N0 1000.0
R1_R4 N0 N3 1000.0
R1_R6 N3 N5 1000.0
R1_R7 N5 C 1000.0
R1_R9 N0 N8 1000.0
R1_R10 N0 N8 1000.0
R1_R11 N8 C 1000.0
R1_R13 N8 N12 1000.0
R1_R14 N12 C 1000.0
R1_R16 N8 N15 1000.0
R1_R17 N15 C 1000.0
R1_R19 N15 N18 1000.0
R1_R20 N18 C 1000.0
R1_R22 N18 N21 1000.0
R1_R23 N21 C 1000.0
* R2 has a Series/parallel Specification.
* (s 2 (p 2 (s 1 (p 8 (s 3)))))
* Value 1000.0 as connected makes 2.34568K
R2_R26 B N25 1000.0
R2_R27 N25 N24 1000.0
R2_R28 N24 D 1000.0
R2_R29 N24 D 1000.0
R2_R31 N24 N30 1000.0
R2_R32 N30 D 1000.0
R2_R33 N30 D 1000.0
R2_R34 N30 D 1000.0
R2_R35 N30 D 1000.0
R2_R36 N30 D 1000.0
R2_R37 N30 D 1000.0
R2_R38 N30 D 1000.0
R2_R39 N30 D 1000.0
R2_R41 N30 N40 1000.0
R2_R43 N40 N42 1000.0
R2_R44 N42 D 1000.0

Again, however, if this netlist is submitted to a conventional place and route tool, the position of the nominal elements will be optimized to minimize whatever aspects the tool is programmed to optimize. For example, again most place and route tools are typically programmed to place the nominal elements in such a way as to minimize a measure of either routing congestion or timing delay, and thus may place nominal elements from different compound elements in close proximity without regard to other considerations such as capacitive coupling between compound elements. In addition, the place and route tool may not achieve the most efficient interconnections between the nominal elements of a single compound element, since the nominal elements may not be adjacent to each other, resulting in a non-minimized interconnection length and a larger additional capacitance to the substrate on which the compound elements are constructed.

The goal of the described method is to constrain the placement of the nominal elements that make up any given compound element such that the nominal elements of one compound element are contained within a single cell and, to the extent possible, do not interact with the nominal elements in any other compound element. This is accomplished by presenting a cell containing multiple nominal elements to the place and route tool so that the tool is forced to place that cell is as a single unit. If the cell contains all of the nominal elements needed for a compound element, the nominal elements of that compound element will be locked into positions relative to each other, and the place and route tool will then be able to make either only local interconnections to the nominal elements within each such compound element, or connections to other cells as required by the netlist for the overall circuit.

In a SPICE netlist format this means that the above netlist, which called for a total of 32 resistors, making up two compound groups of 16 resistors each, is replaced with the following netlist:

```
* RX 1 has a Series/parallel Specification.
* (s (p 2) (p (s 3) (s (p 2) (p 1 (s 2) (s 1 (p 1 (s 1 (p 1 (s 2))))))))
* Value 1000.0 as connected makes 1.23455K
XRX1 N21 N18 N18 N15 N8 N12 N8 N8 N0 N0 N5 N3 N0 A A
+ C N21 C N18 C N15 C N12 C N8 N8 C N5 N3 N0 N0 RSP16
* RX2 has a Series/parallel Specification.
* (s 2 (p 2 (s 1 (p 8 (s 3)))))
* Value 1000.0 as connected makes 2.34568K
XRX2 N42 N40 N30 N30 N30 N30 N30 N30 N30 N30 N30 N24
N24 N24 N25 B
+ D N42 N40 D D D D D D D D N30 D D N24 N25 RSP16
```

This netlist consists of two calls to a sub-circuit, i.e. another netlist, here called RSP16 (the 16 reflecting the 16 nominal resistors in each cell). The connectivity of elements to make the target value is expressed in the arguments of the call to the sub-circuit, so that the sub-circuit itself does not change but is the same for all instances of a compound resistor, and the place and route tool then connects the elements of each sub-circuit according to the arguments of the call.

In SPICE netlist format, the sub-circuit RSP16 is shown as:

```
.subckt RSP16
+A[15] A[14] A[13] A[12] A[11] A[10] A[9] A[8] A[7] A[6] A[5] A[4]
+A[3] A[2] A[1] A[0]
+B[15] B[14] B[13] B[12] B[11] B[10] B[9] B[8] B[7] B[6] B[5] B[4]
+B[3] B[2] B[1] B[0]
R1 A[0] B[0] 1k
R1_1 A[1] B[1] 1k
R1_2 A[2] B[2] 1k
R1_3 A[3] B[3] 1k
R1_4 A[4] B[4] 1k
R1_5 A[5] B[5] 1k
R1_6 A[6] B[6] 1k
R1_7 A[7] B[7] 1k
R1_8 A[8] B[8] 1k
R1_9 A[9] B[9] 1k
R1_10 A[10] B[10] 1k
R1_11 A[11] B[11] 1k
R1_12 A[12] B[12] 1k
R1_13 A[13] B[13] 1k
R1_14 A[14] B[14] 1k
R1_15 A[15] B[15] 1k
.ends RSP16
```

Figure 3:
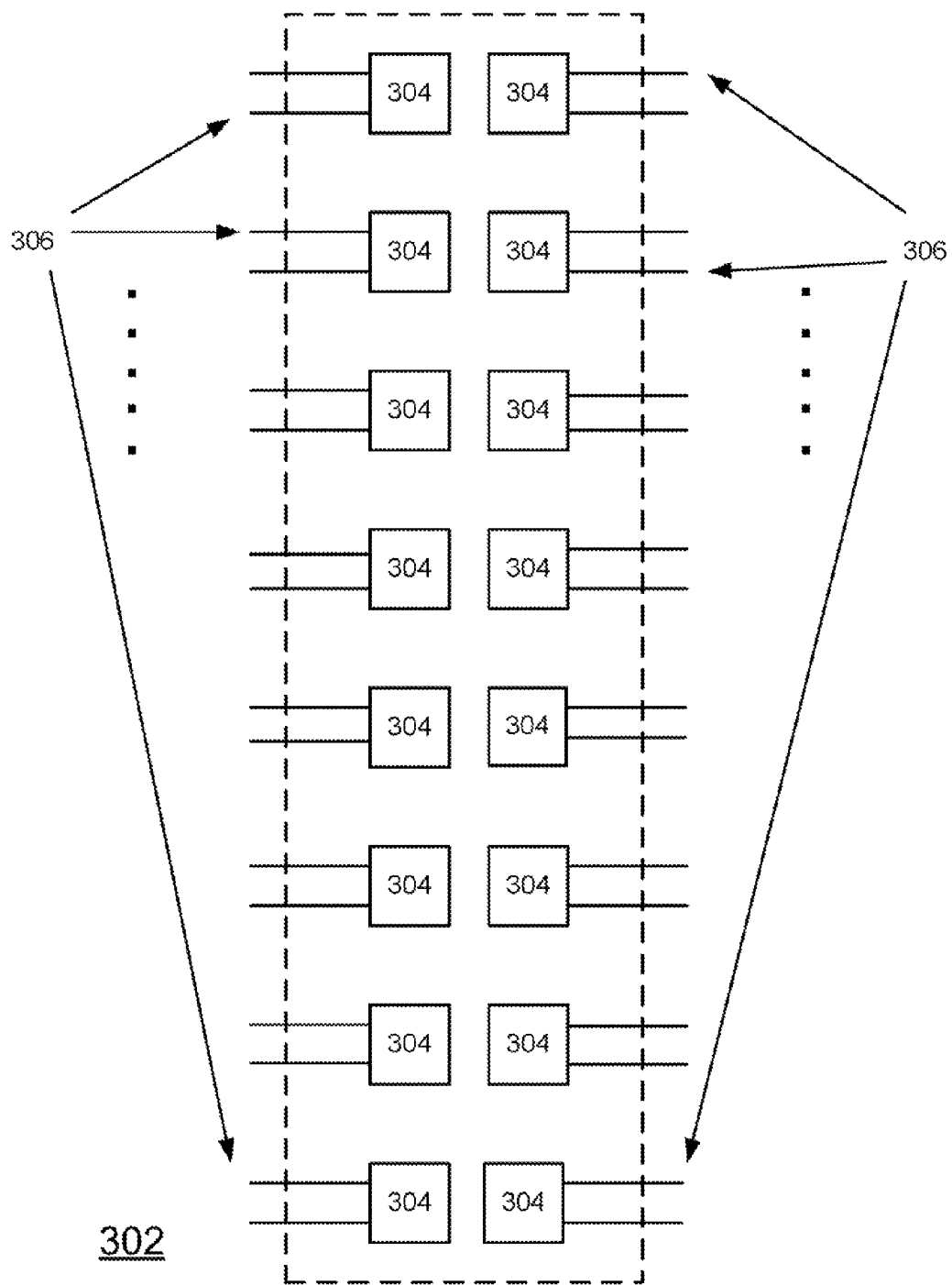
FIG. 3 shows one embodiment of a uniform cell that may be used to make compound elements and may be sent to a place and route tool.

One example of such a sub-circuit, here the RSP16 cell, is shown in FIG. 3. Sub-circuit 302 contains 16 nominally identical resistors 304, and each such resistor 304 has two ports 306. The ports 306 allow for a connection between a nominal element and another nominal element within the cell or between the cell and another cell on the semiconductor chip. (Resistors are perceived as having two ports, or ends; of course, as is known in the art, a resistor may be connected to more than two other resistors or components, and thus a port may be connected to more than two other resistor ports, or more than two other cells.)

Note that the level of hierarchy used to represent the nominal elements of the compound element, here the RSP16 cell, may consist of any arbitrary number of instances of the nominal element, i.e., the cell may contain 16 nominal elements, or 24, or any other desired or necessary number. Sixteen resistors are shown here as that is an example used in the '097 patent; for reasons explained therein, a designer may wish to select a different number of resistors.

The value of this approach lies in the way that the place and route tool will now perform its task. The tool will now keep each of the individual nominally identical elements of a sub-circuit, i.e., compound element, together, since for placement purposes each compound element now appears as a single identical cell in each case. Only once the cells are placed will the connections be made between the ports to the nominal elements inside, such as ports 306 in FIG. 3, to create the desired series/parallel combination for each particular cell.

Any nominal elements that are not required by the series/parallel descriptor returned by the algorithm to result in the target value may be preferably ignored, i.e., left unconnected, or tied together, or connected to a global node as desired. Thus, since all of the nominal elements in a cell are in close proximity to each other, all of the nominal elements in a single compound element will also be in close proximity to each other, and will only interact with the nominal elements in another compound element to a lesser extent than might occur in the absence of the described method due to fewer adjacencies of the nominal elements of different cells and/or buffer areas around each cell.

Figure 4:
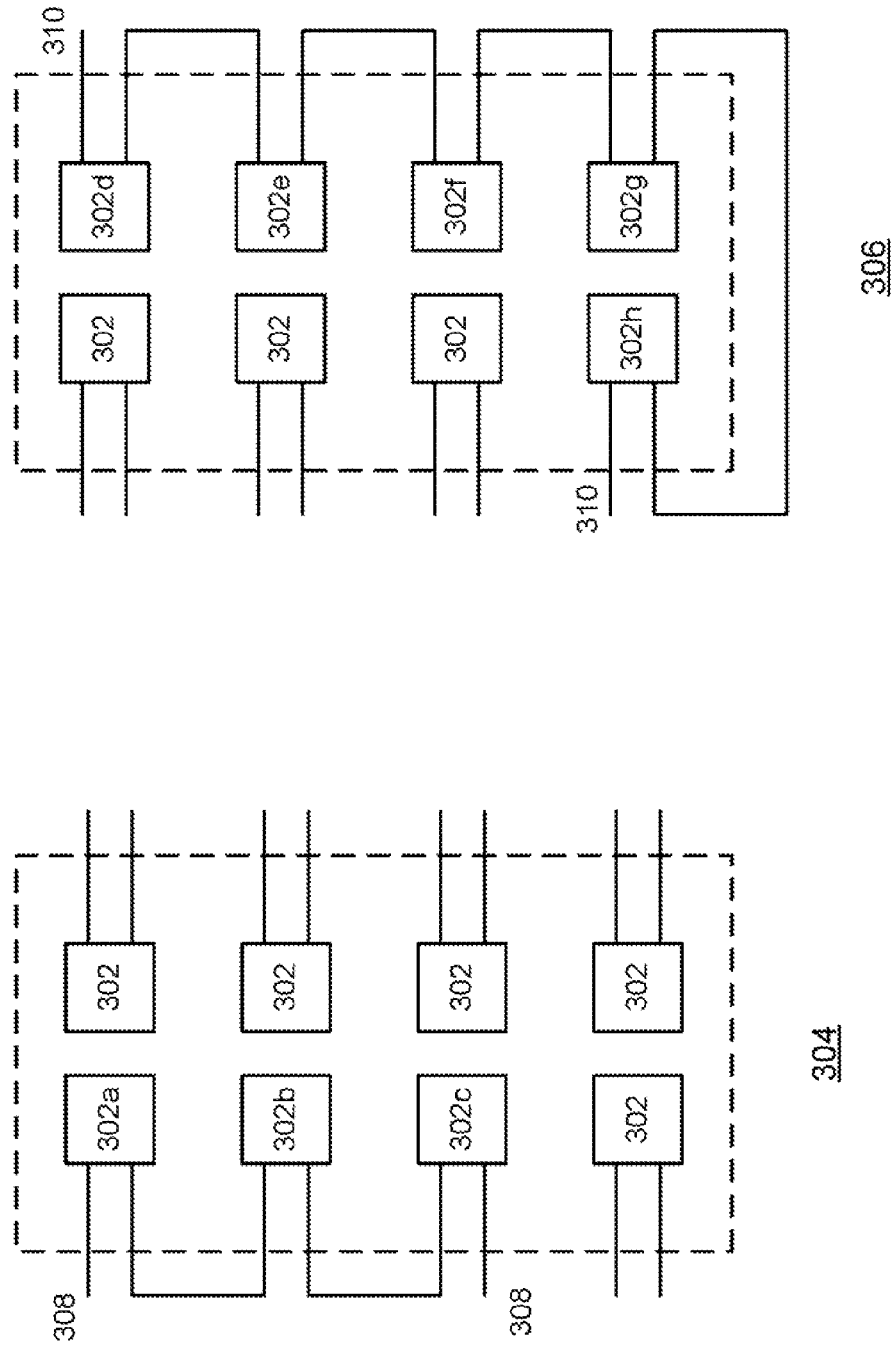
FIG. 4 shows the compound elements of FIG. 1 when treated according to one embodiment of the described method.

FIG. 4 shows how the "compound resistors" of FIG. 1 might appear using the described method, and defining the 3 kΩ and 5 kΩ resistors as separate cells. Rather than the nominal resistors of both the 3 kΩ and 5 kΩ resistors being placed in straight lines adjacent to one another as in FIG. 1, each compound resistor will be contained in a separate cell of eight nominal resistors 302. Thus, the 3 kΩ resistor is contained in cell 304, and the 5 kΩ resistor is contained in cell 306. While the cells containing the two compound resistors may still be placed adjacent to each other, the nominal elements in the compound resistors are less likely to be as close as they might be in the configuration of FIG. 1, particularly if the cells are defined to have a border area separating them from adjacent cells.

Three nominal resistors 302a to 302c in cell 304 are connected in series by connecting their ports to make the 3 kΩ resistance, and five nominal resistors 302d to 302h in cell 306 are connected in series to make the 5 kΩ resistance. Any of the nominal resistors 302 that are not needed to make the 3 kΩ or 5 kΩ resistors are simply not connected. The place and route tool will first connect the ports of the resistors in each cell needed to make the desired compound element; thus, the tool will connect resistors 302a to 302c in series, and resistors 302d to 302h in series. Once this is done, the tool will then attempt to find the best interconnection between the cells containing the compound resistors and any other cells in the overall circuit for which the netlist defines connections. Ports 308 allow for connection of the 3 kΩ resistance to other elements of the circuit, while ports 310 allow for connection of the 5 kΩ resistance to the circuit.

By contrast, in FIG. 1, when the place and route tool is free to place the nominally identical resistors anywhere, the compound 3 kΩ and 5 kΩ resistors have been made by placing the nominally identical resistors in lines adjacent to one another, which can result in stray capacitance between the compound resistors. On the other hand, in FIG. 4 each compound resistor is contained within a separate cell, and the stray capacitance is reduced or eliminated due to the greater distance between the nominally identical resistors in each compound resistor.

Figure 5:
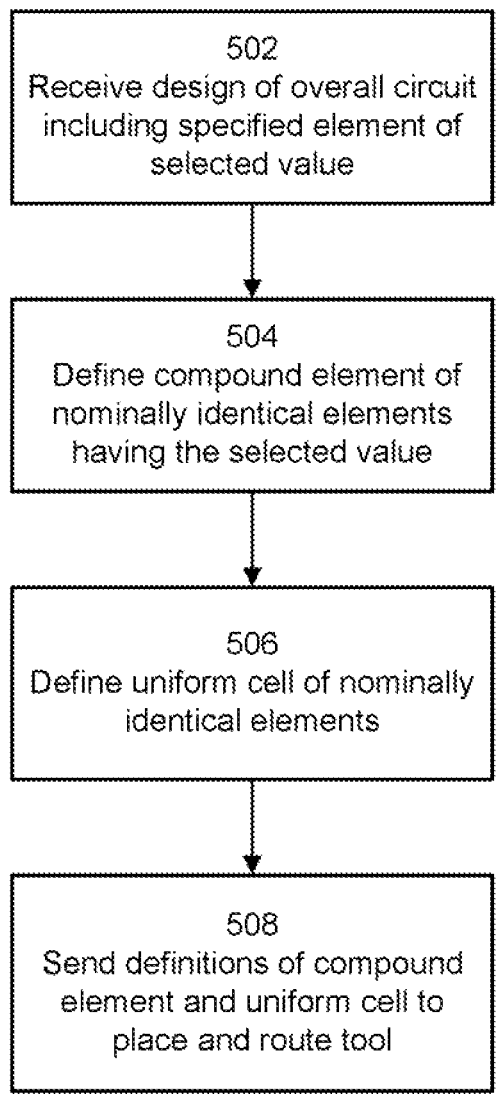
FIG. 5 is a flowchart illustrating one possible embodiment of a method as described herein.

FIG. 5 is a flowchart of one embodiment of the method described herein. At step 502, a design of an overall circuit is received, including a specified element having a selected value and appropriate for a compound element, i.e., suitable of being made as a series and/or parallel combination of some number of nominally identical elements. For example, as in the '097 patent, and as described above, any specified resistors or other impedance elements having an arbitrary selected value may be made as compound elements constructed from nominally identical impedance elements. This received circuit design may have been created by a designer, or by some automated method; such methods are known to those of skill in the art. In practice this overall circuit design will typically be represented by a first netlist.

As step 504, a compound element is defined as a series and/or parallel combination of a selected number of nominally identical elements, such that the overall value of the compound element is the arbitrary value of the specified element. Again, the series/parallel combination may be determined by, for example, the method of the '097 patent or that of the '780 application. In practice, the compound element will be represented by a second netlist representing the selected number of nominally identical elements to be used to make the compound element and the connections between those nominally identical elements.

At step 506, a uniform cell is defined containing the selected number of nominally identical elements, with unconnected ports for each of the nominally identical elements. This uniform cell will later be configured as the compound element. Again, as explained above, the uniform cell will typically be defined by calling a third netlist. As in the example of FIG. 4, each nominally identical element has an appropriate number of ports which allow the nominally identical element to be connected to one or more of the other nominally identical elements in the uniform cell or to another cell; thus, nominally identical resistors, inductors or capacitors will have two ports, while FETs, for example, will have three ports.

At step 508 the the definition of the compound element and the definition of the uniform cell are sent to a place and route tool. The overall circuit design may optionally also be sent to the place and route tool along with the definitions, or the overall design may be retrieved separately by the place and route tool from another source, such as the designer or program which created it. Alternatively, rather than sending the definitions to the tool, the definitions may be stored for later retrieval by the tool, again with or without the overall circuit design.

The place and route tool will perform three functions according to the programming which is typical in place and route tools. First, the tool will place a uniform cell, along with the other cells in the overall circuit design, according to the placement algorithm of the tool. The tool will then connect the ports of the nominally identical elements in the uniform cells such that the nominally identical elements in the uniform cell are connected in the series/parallel combination defined for the compound element. Finally, the tool will connect the uniform cell, which is now also the compound element, to other cells, i.e., components, of the overall circuit as defined by the first netlist.

As above, in practice it is expected that the compound element will typically be provided to the place and route tool by a first netlist; the first netlist calls a second netlist defining a uniform cell to be placed, and then provides instructions to the tool to route connections between the ports of the uniform cell to create the compound element. A third netlist, that of the overall circuit, then instructs the tool how to connect the now completed cell containing the compound element to the rest of the circuit.

Several other variations of the steps shown in FIG. 5 will be apparent to one of skill in the art. While the example of FIG. 5 uses only a single compound element, and thus a single uniform cell, it will be clear to one of skill in the art that there may be any number of compound elements, or multiple instances of identical compound elements. Each compound element will have a definition in the netlist; each such definition will call for the placement of a separate uniform cell, which is then completed by routing connections between ports of the uniform cell according to the corresponding definition.

The described steps will typically be performed by a processor. Steps 504 and 506 may be reversed, i.e., the uniform cell may be defined before the compound elements; in either case, the definition of the compound elements contains instructions for the place and route tool to connect some or all of the ports of the nominally identical elements of an instance of the uniform cell so as to form a compound element with the selected value of the specified element.

In this way, the described method allows for compound elements to be created according to the methods of the '097 patent and the '780 application, and for those compound elements to be placed and routed automatically by conventional place and route tools while avoiding problems that might otherwise arise if the nominally identical elements in the compound elements were to be placed individually.

The disclosed system and method has been explained above with reference to several embodiments. Other embodiments will be apparent to those skilled in the art in light of this disclosure. Certain aspects of the described method and apparatus may readily be implemented using configurations or steps other than those described in the embodiments above, or in conjunction with elements other than or in addition to those described above.

For example, while resistors have been used for ease of illustration, as noted above inductors, capacitors, field-effect transistors, and other components may also be elements in a uniform cell that is defined and sent to a place and route tool using the techniques described herein. Thus, in some cases it might be desirable to define a uniform cell containing a first plurality of nominally identical resistors of a first nominal value and a second plurality of nominally identical resistors of a second nominal value, and a compound resistor might be made by combining nominal resistors from both pluralities. Similarly, a different uniform cell might be defined containing a first plurality of nominally identical resistors, a second plurality of nominally identical capacitors, and a third plurality of nominally identical inductors, or even contain multiple pluralities of the different types of elements having different values. The described method may still be advantageously used whenever it is desirable to have a uniform cell that may be configured to make compound elements having multiple values by changing the routing of the elements contained therein to create different series/parallel combinations of the elements contained in the uniform cell, and to keep the elements of such compound elements together during the placement process.

It should also be appreciated that the described method and apparatus can be implemented in numerous ways, including as a process, an apparatus, or a system. The methods described herein may be implemented by program instructions for instructing a processor to perform such methods, and such instructions recorded on a non-transitory computer readable storage medium such as a hard disk drive, floppy disk, optical disc such as a compact disc (CD) or digital versatile disc (DVD), flash memory, etc. The methods may also be incorporated into hard-wired logic if desired. It should be noted that the order of the steps of the methods described herein may be altered and still be within the scope of the disclosure.

These and other variations upon the embodiments are intended to be covered by the present disclosure, which is limited only by the appended claims.

What is claimed is:

1. A method of improving placement and routing of components on a semiconductor chip by treating certain items at separate levels of design hierarchy, comprising:
   receiving by a processor a design of an overall circuit defined at a first level of design hierarchy including a specified element having a selected value and that is suitable of being made as a series and/or parallel combination of a plurality of nominally identical elements;
   defining by the processor at a second level of design hierarchy a uniform cell requiring a place and route tool to place the uniform cell as a single unit within the overall circuit, the definition:
      including a selected number of the nominally identical elements, each nominally identical element having a plurality of ports; and
      not including any connections of the ports of the nominally identical elements;
   defining by the processor at the second level of design hierarchy a compound element as a series and/or parallel combination of some or all of the selected number of the nominally identical elements, such that:
      the value of the compound element is the selected value of the specified element; and
      the definition of the compound element has instructions for the place and route tool to connect some or all of the ports of the nominally identical elements of the defined uniform cell so as to form the compound element.

2. The method of claim 1, further comprising sending by the processor the definitions of the uniform cell and the compound element to the place and route tool.

3. The method of claim 1, further comprising storing by the processor the definitions of the uniform cell and the compound element for retrieval by the place and route tool.

4. The method of claim 1 wherein the definitions of the uniform cell and the compound element comprise netlists.

5. The method of claim 1, wherein the specified element is selected from the group consisting of resistors, inductors and capacitors.

6. The method of claim 1, wherein the specified element is a field-effect transistor.

7. The method of claim 1, wherein defining by the processor at the second level of design hierarchy a compound element further comprises:
   determining by the processor all possible series and/or parallel combinations of the selected number of nominally identical elements;
   calculating by the processor a first value of each determined combination based upon a unity value of each nominally identical element; and
   calculating by the processor an actual value for the nominally identical element that, when multiplied by the first value of one of the series and/or parallel combinations results in the selected value of the specified element.

8. A method of improving placement and routing of components on a semiconductor chip by treating certain items at separate levels of design hierarchy, comprising:
   receiving by a processor a design of an overall circuit defined at a first level of design hierarchy including a first specified element having a first selected value and a second specified element having a second selected value, the first and second specified elements each suitable of being made as a series and/or parallel combination of a plurality of nominally identical elements;
   defining by the processor at a second level of design hierarchy a uniform cell requiring a place and route tool to place the uniform cell as a single unit within the overall circuit, the definition:
      including a selected number of the nominally identical elements, each nominally identical element having a plurality of ports; and
      not including any connections of the ports of the nominally identical elements;
   defining by the processor at the second level of design hierarchy a first compound element and a second compound element each as a separate series and/or parallel combination of some or all of the selected number of the nominally identical elements, such that:
      the value of the first compound element is the selected value of the first specified element and the value of the second compound element is the selected value of the second specified element; and
      the definition of the first compound element has instructions for the place and route tool to connect some or all of the ports of the nominally identical elements of a first instance of the defined uniform cell so as to form the first compound element, and the definition of the second compound element has instructions for the place and route tool to connect some or all of the ports of the nominally identical elements of a second instance of the defined uniform cell so as to form the second compound element.

9. The method of claim 8, further comprising sending by the processor the definitions of the uniform cell and the first and second compound elements to the place and route tool.

10. The method of claim 8, further comprising storing by the processor the definitions of the uniform cell and the first and second compound elements for retrieval by the place and route tool.

11. The method of claim 8 wherein the definitions of the uniform cell and the first and second compound elements comprise netlists.

12. The method of claim 8, wherein the first specified element and the second specified element are each selected from the group consisting of resistors, inductors and capacitors.

13. The method of claim 8, wherein at least one of the first specified element and the second specified element is a field-effect transistor.

14. The method of claim 8, wherein defining by the processor at the second level of design hierarchy a compound element further comprises:
   determining by the processor all possible series and/or parallel combinations of the selected number of nominally identical elements;
   calculating by the processor a first value of each determined combination based upon a unity value of each nominally identical element; and
   calculating by the processor an actual value for the nominally identical element that, when multiplied by the first value of one of the series and/or parallel combinations results in the selected value of the specified element.

15. A non-transitory computer readable storage medium having embodied thereon instructions for causing a computing device to execute a method of improving placement and routing of components on a semiconductor chip by treating certain items at separate levels of design hierarchy, the method comprising:
   receiving by a processor a design of an overall circuit defined at a first level of design hierarchy including a specified element having a selected value and that is suitable of being made as a series and/or parallel combination of a plurality of nominally identical elements;
   defining by the processor at a second level of design hierarchy a uniform cell requiring a place and route tool to place the uniform cell as a single unit within the overall circuit, the definition:
      including a selected number of the nominally identical elements, each nominally identical element having a plurality of ports; and
      not including any connections of the ports of the nominally identical elements;
   defining by the processor at the second level of design hierarchy a compound element as a series and/or parallel combination of some or all of the selected number of the nominally identical elements, such that:
      the value of the compound element is the selected value of the specified element; and
      the definition of the compound element has instructions for the place and route tool to connect some or all of the ports of the nominally identical elements of the defined uniform cell so as to form the compound element.

16. The non-transitory computer readable medium of claim 15, wherein defining by the processor at the second level of design hierarchy a compound element further comprises:
   determining by the processor all possible series and/or parallel combinations of the selected number of nominally identical elements;
   calculating by the processor a first value of each determined combination based upon a unity value of each nominally identical element; and
   calculating by the processor an actual value for the nominally identical element that, when multiplied by the first value of one of the series and/or parallel combinations results in the selected value of the specified element.

* * * * *